United States Patent
Shiba

(10) Patent No.: US 6,480,124 B2
(45) Date of Patent: Nov. 12, 2002

(54) CAD DATA COMPRESSING METHOD AND APPARATUS THEREOF

(75) Inventor: Hisashi Shiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/729,710

(22) Filed: Dec. 6, 2000

(65) Prior Publication Data

US 2001/0004245 A1 Jun. 21, 2001

(30) Foreign Application Priority Data

Dec. 15, 1999 (JP) .......................... 11-356120

(51) Int. Cl.⁷ ................................ H03M 7/00
(52) U.S. Cl. .................... 341/50; 345/420; 345/423; 716/4
(58) Field of Search ............. 341/50, 51, 67; 345/420, 441, 559, 433, 423; 716/4

(56) References Cited

U.S. PATENT DOCUMENTS 5,138,697 A * 8/1992 Yamamoto et al. ......... 345/420
5,734,874 A * 3/1998 Van Hook et al. .......... 345/559
5,859,646 A * 1/1999 Takenaka .................... 345/433

FOREIGN PATENT DOCUMENTS

| JP | 5-29188 | 2/1993 |
|---|---|---|
| JP | 5-266135 | 10/1993 |
| JP | 5-342306 | 12/1993 |
| JP | 9-17709 | 1/1997 |
| JP | 9-128421 | 5/1997 |
| JP | 10-149378 | 6/1998 |
| JP | 11-65085 | 3/1999 |
| JP | 11-224272 | 8/1999 |

OTHER PUBLICATIONS

Article –"Microsoft Access 97" (1997) –J. Viescas. (no month).

* cited by examiner

Primary Examiner—Peguy JeanPierre
Assistant Examiner—Jean Bruner JeanGlaude
(74) Attorney, Agent, or Firm—Foley & Lardner

(57) ABSTRACT

A CAD data compressing method is disclosed, that comprises the steps of generating a component figure list, and generating data of a plurality of pattern groups each containing a pointer to a component figure of the component figure list.

39 Claims, 15 Drawing Sheets

FIG. 1

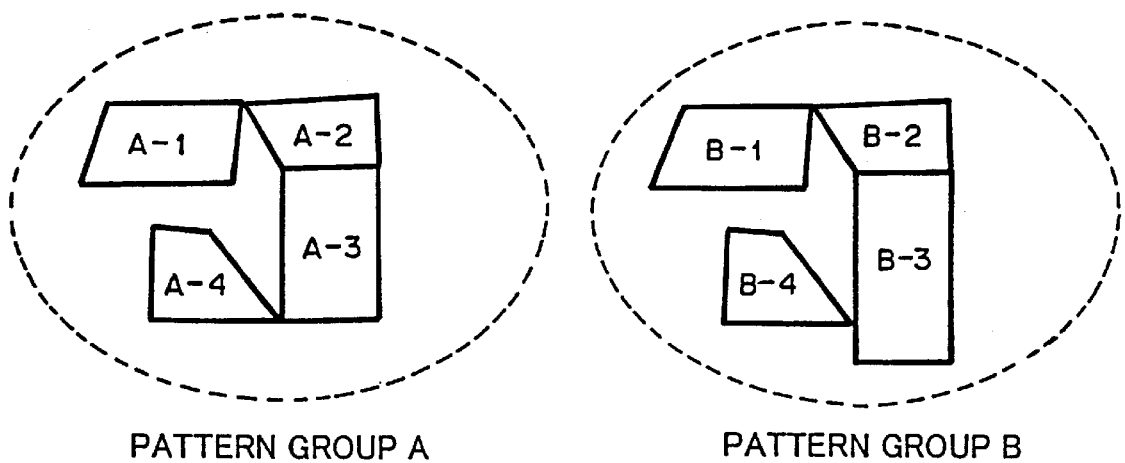

PATTERN GROUP A  PATTERN GROUP B

PATTERN GROUP LIST

| PATTERN GROUP A | PATTERN GROUP B |
|---|---|
| BASIC FIGURE A-1 | BASIC FIGURE B-1 |
| VERTEX COORDINATES | VERTEX COORDINATES |
| BASIC FIGURE A-2 | BASIC FIGURE B-2 |
| VERTEX COORDINATES | VERTEX COORDINATES |
| BASIC FIGURE A-3 | BASIC FIGURE B-3 |
| VERTEX COORDINATES | VERTEX COORDINATES |
| BASIC FIGURE A-4 | BASIC FIGURE B-4 |
| VERTEX COORDINATES | VERTEX COORDINATES |

FIG.3 PRIOR ART

EXAMPLE OF DATA STRUCTURE OF REPETITIVE PATTERN

| REPETITION INFORMATION (NUMBER OF TIMES, INTERVALS, COORDINATES OF START POINT) |
|---|
| FIGURE 1 |
| COORDINATES OF VERTEX 1 |
| COORDINATES OF VERTEX 2 |
| ⋮ |
| COORDINATES OF VERTEX Q |

EXAMPLE OF DATA STRUCTURE OF PATTERN GROUP

| NUMBER OF FIGURES P |
|---|
| FIGURE 1 |
| COORDINATES OF VERTEX 1 |
| COORDINATES OF VERTEX 2 |
| ⋮ |
| COORDINATES OF VERTEX K |
| FIGURE 2 |
| COORDINATES OF VERTEX 1 |
| COORDINATES OF VERTEX 2 |
| ⋮ |
| COORDINATES OF VERTEX L |
| ⋮ |
| FIGURE P |
| COORDINATES OF VERTEX 1 |
| COORDINATES OF VERTEX 2 |
| ⋮ |
| COORDINATES OF VERTEX M |

EXAMPLE OF DATA STRUCTURE OF SINGLE FIGURE

| COORDINATES OF VERTEX 1 |
|---|
| COORDINATES OF VERTEX 2 |
| ⋮ |
| COORDINATES OF VERTEX N |

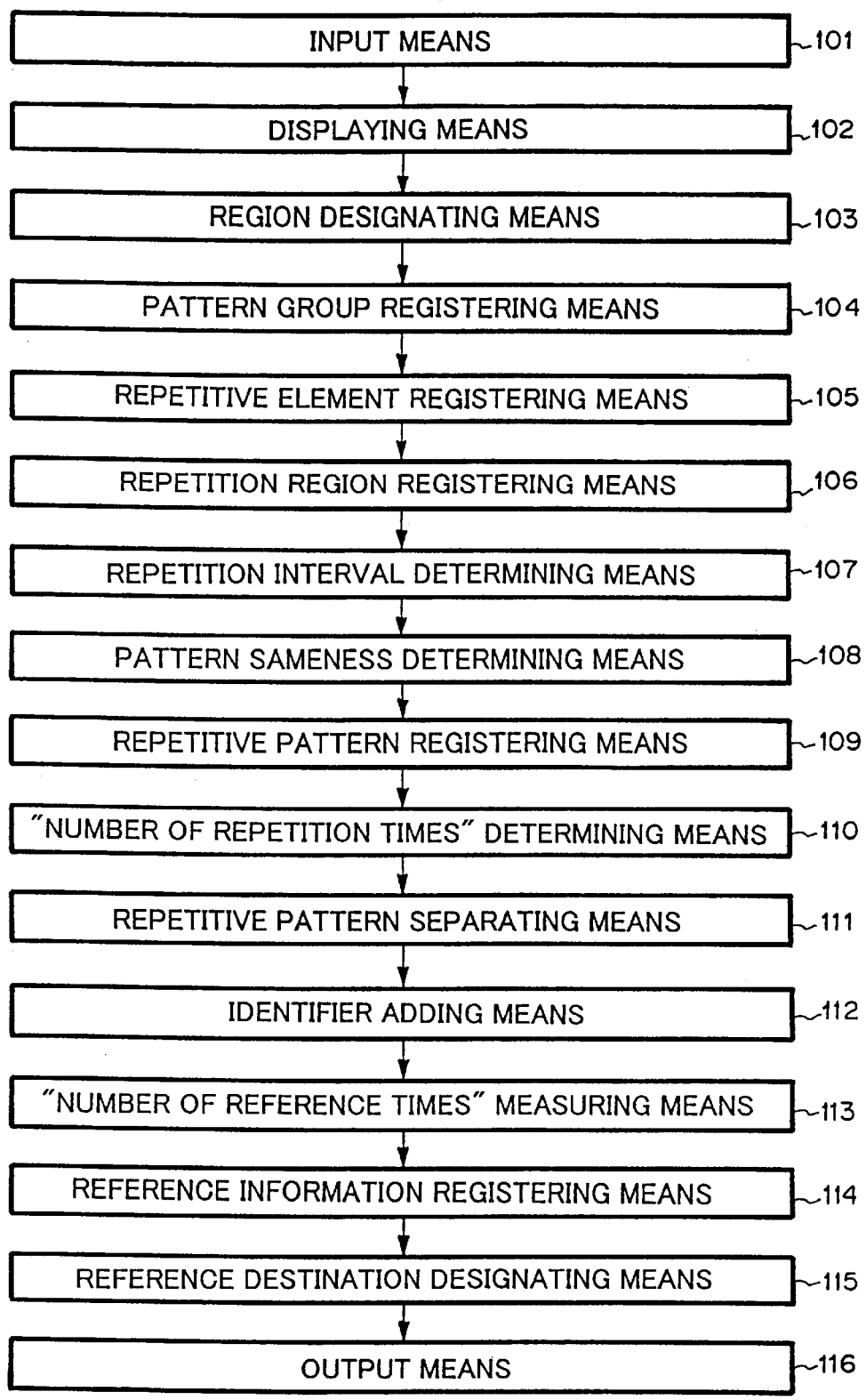

FIG.8

| REPETITIVE PATTERN H |
|---|
| WHEN NUMBER OF REPETITION TIMES IS 1024, 10 BITS ARE REQUIRED. |
| REPETITION INTERVALS |
| COORDINATES OF REPETITIVE START POINT |
| COORDINATES OF VERTEX OF REPETITIVE FIGURE |

| REPETITIVE PATTERN J |
|---|
| WHEN NUMBER OF REPETITION TIMES IS 1152, 11 BITS ARE REQUIRED. |
| REPETITION INTERVALS |
| COORDINATES OF REPETITIVE START POINT |
| COORDINATES OF VERTEX OF REPETITIVE FIGURE |

FIG.14

| . . . . . . . |
|---|
| . . . . . . . |
| START OF SINGLE FIGURE LIST |
| . . . . . . . |
| . . . . . . . |
| END OF SINGLE FIGURE LIST |
| START OF COMPONENT FIGURE LIST |
| . . . . . . . |
| . . . . . . . |
| END OF COMPONENT FIGURE LIST |
| START OF PATTERN GROUP LIST |
| . . . . . . . |
| . . . . . . . |
| END OF PATTERN GROUP LIST |
| START OF REPETITIVE PATTERN LIST |
| . . . . . . . |
| . . . . . . . |
| END OF REPETITIVE PATTERN LIST |
| . . . . . . . |
| . . . . . . . |

FIG.17
DESIGNATE FIGURES IN CIRCLE AS PATTERN GROUP.
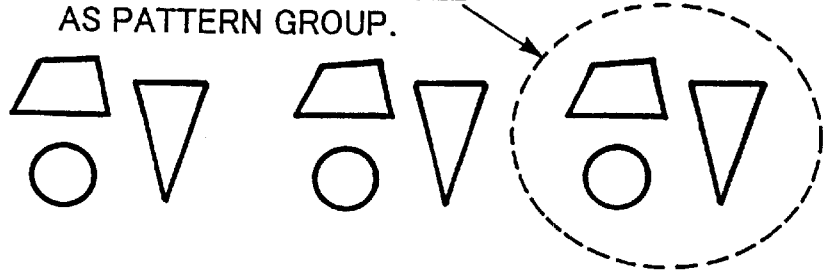
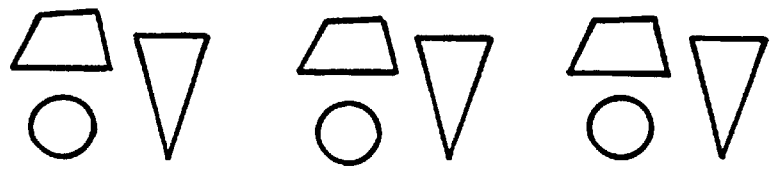
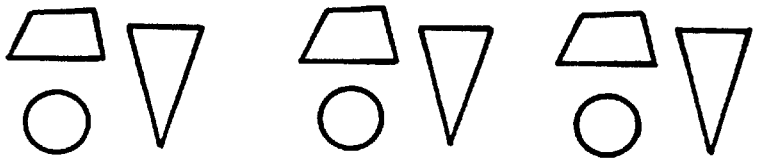
FIG.18
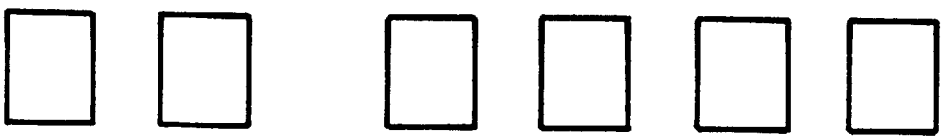
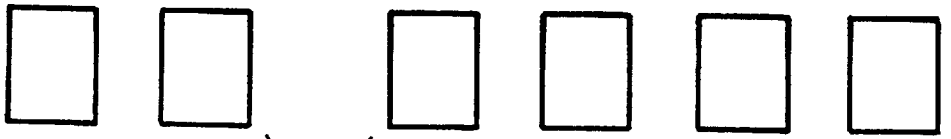
REPETITION INTERVALS DIFFER IN HORIZONTAL DIRECTION.
IN THIS DRAWING, THE DIFFERENCE IS EMPHASIZED.

SHAPE OF THIS FIGURE DIFFERS FROM OTHERS.

CAD DATA COMPRESSING METHOD AND APPARATUS THEREOF

BACKGROUND OF THE INVENTION

1. Field of the Invention

The present invention relates to a data compressing method and a data compressing apparatus and in particular, to a CAD (Computer Aided Design) data compressing method and an apparatus thereof.

2. Description of the Prior Art

As semiconductor devices are being microscopically structured, the data amount of CAD data for drawing patterns of masks and reticles used for a lithographing process of a semiconductor fabrication is drastically increasing. When CAD data is created, a data amount compressing method using a feature that drawing patterns are repeated is used. However, even if CAD data is compressed, because the resultant data may be as large as several Gbytes, whereas the file size has an upper limit of 1 Gbytes to 4 Gbytes, conventional operating systems cannot handle such a huge the CAD data. Although a particular OS version may handle such a huge file, the huge file occupies a large disc space. Consequently, it is difficult to use many files of CAD data on the same disc. In addition, since the data amount of CAD data is large, it takes a long time to transmit a file of CAD data through a network as well as reading and writing it. Therefore, in addition to drawing a pattern, it takes a long time to prepare the drawing operation. Moreover, when defects of a mask and a reticle are inspected, such CAD data should be handled. Thus, the inspection time tends to become long. Consequently, the data amount of CAD data should be further reduced.

Fertman and Ashida of Sony Corp (JPA 9-128421) and Tsujimura of Fujitsu Limited (JPA 5-29188) disclose CAD data compressing methods. According to these methods, a repetitive pattern group is stored to a dedicated area of a file or a separate file. When such a repetitive pattern group is described, only the position thereof is referenced. As a result, the same pattern group can be prevented from being repetitively described. As a result, CAD data can be compressed at high compression ratio. In that case, a pattern group represents a set of rectangles and trapezoids that are basic figures of CAD data of masks and reticles. A similar, but not the same, technology has been used in a CAD format of a mask drawing apparatus of Nippon Denshi K.K. (JBX-7000 MV, JEOL 52 (V.2.1) format specification). Moreover, Nakajima and Oonuma of Sony Corp. (JPA 10-149378) disclose another CAD data compressing method. According to the CAD data compressing method, repetition information such as repetition intervals of a pattern group and the number of repetition times is stored to a dedicated area of a file or another file. When the pattern group is repeated, the repetition information is referenced. Thus, repetition information can be prevented from being redundantly described. As a result, the compression ratio of CAD data is improved.

However, such prior art references have disadvantages as follow:.

(1) Even if a part of basic figures in a pattern group is the same as a part of basic figures in another pattern group, the presence of such a common basic is not described. Thus, if a pattern group is slightly different from another pattern group, they are registered as different pattern groups with a list (see FIG. 1).

(2) There is no description as to how to handle a CAD data in which repetitive figures and non-repetitive figures co-exist.

(3) Although repetitive figures and repetitive pattern groups are registered with a list, if they are referenced only one time, information amount that represents the reference destination is additionally required (show in FIG. 2).

(4) If the number of repetition times of a repetitive figure is large, the information amount (the number of bits) that represents the number of repetition times becomes large. Thus, the number of bits exceeds a pre-allocated memory area. In contrast, if the pre-allocated memory area is too large, the compression effect will deteriorate. For example, if the number of repetition times of a repetitive pattern is 255 or less, the number of repetition times can be represented by 8 bits. However, even if the number of repetition times of a single repetitive pattern exceeds 255, the number of repetition times must be 9 bit or more.

(5) There is no description as to whether repeated is a single figure, a pattern group composed of a plurality of figures, or a pattern repeated once more. If each data structure is different from other data structure and pattern types are not identified, data are not correctly developed (shown in FIG. 3).

(6) According to the prior art references of Fertman, Ashida, Nakajima, and Oonuma, figures that constitute one pattern group are determined depending on whether repetition information of figures in a particular region is the same. However, when the number of figures contained in the region is very large, such a searching method requires a very long time.

(7) As a procedure for determining whether or not an inspected figure is repeated, Fertman and Ashida has proposed a technology for automatically extracting repetition information. However, the method using repetition information of CAD data disclosed by Nakajima and Oonuma is superior to the method disclosed by Fertman and Ashida in compressing time. However, even in the method disclosed by Nakajima and Oonuma, if the numbers of repetition times in the repetition information are different from one another, the repetition information is not compressed.

SUMMARY OF THE INVENTION

The present invention has been made to solve the aforementioned disadvantages.

According to a first aspect of the present invention, there is provided a CAD data compressing method, comprising the steps of: generating a component figure list; and generating data containing a pointer to a component figure in said component figure list for each of pattern groups.

The CAD data compressing method according to the first aspect of the present invention may further comprises the step of: if a single figure which is repeated is contained in said component figure list as a component figure, generating data containing a pointer to said component figure in said component figure list.

According to a second aspect of the present invention, there is provided a CAD data compressing method, comprising the steps of: generating data of a common pattern group composed of a plurality of basic figures common among a plurality of pattern groups; and generating data containing a pointer to said common pattern group for each of said plurality of pattern groups.

According to a third aspect of the present invention, there is provided a CAD data compressing method, comprising the steps of: generating a component figure list; and generating data containing a pointer to a component figure in said component figure list for each of isolated figures.

According to a fourth aspect of the present invention, there is provided a CAD data compressing method, comprising the steps of: generating a component figure list; and generating data containing a pointer to a component figure in said component figure list for each of isolated figures, each of pattern groups, and each of repetitive patterns.

According to a fifth aspect of the present invention, there is provided a CAD data compressing method, comprising the steps of: generating data of a first repetitive pattern whose number of repetition times is represented by a predetermined number of bits; and generating data of a second repetitive pattern containing a pointer to said data of said first repetitive pattern.

According to a sixth aspect of the present invention, there is provided a CAD data compressing method, comprising the steps of: generating data of a first repetitive pattern whose number of repetition times is represented by a first predetermined number of bits; generating data of a second repetitive pattern whose number of repetition times is represented by the first predetermined number of bits or a second predetermined number of bits; and generating data of a third repetitive pattern containing a pointer to said data of said first repetitive pattern and a pointer to said data of said second repetitive pattern.

According to a seventh aspect of the present invention, there is provided a CAD data compressing method, comprising the steps of: generating first data of a component figure, a single figure, a pattern group, or a repetitive pattern; and generating second data of a repetitive pattern containing a pointer to said first data and an identifier representing that said first data which is pointed by said pointer is of said component figure, said single figure, said pattern group, or said repetitive pattern.

According to a eighth aspect of the present invention, there is provided a CAD data compressing method, comprising the steps of: generating a set of first data of a component figure, a single figure, a pattern group, or a repetitive pattern and an identifier representing that said first data is of said component figure, said single figure, said pattern group, or said repetitive pattern; and generating second data of a repetitive pattern containing a pointer to the generated set.

According to a ninth aspect of the present invention, there is provided a CAD data compressing method, comprising the steps of: generating first data of a component figure, a single figure, a pattern group, or a repetitive pattern in one of designated regions for a component figure, a single figure, a pattern group, and a repetitive pattern; and generating second data of a repetitive pattern containing a pointer to said first generated data.

According to a tenth aspect of the present invention, there is provided a CAD data compressing method, comprising the steps of: generating first data of a component figure, a single figure, a pattern group, or a repetitive pattern in one of designated files for a component figure, a single figure, a pattern group, and a repetitive pattern; and generating data of a repetitive pattern containing a pointer to said first data.

According to a eleventh aspect of the present invention, there is provided a CAD data compressing method, comprising the steps of: selecting a repetitive pattern group from an input figure group corresponding to a user's operation of an input device; and determining whether or not the selected pattern group is regularly repeated corresponding to CAD data which is an input compression source.

The CAD data compressing method according to the eleventh aspect of the present invention may further comprise the step of: selecting a region for determining whether or not the selected pattern group is regularly repeated corresponding to the user's operation of the input device.

These and other objects, features and advantages of the present invention will become more apparent in light of the following detailed description of the best mode embodiment thereof, as illustrated in the accompanying drawings.

BRIEF DESCRIPTION OF DRAWINGS

FIG. 1 is a schematic diagram showing an example of the structure of CAD data according to a prior art reference;

FIG. 3 is a schematic diagram for explaining a fifth problem of the prior art references;

FIG. 4 is a block diagram showing the structure of a CAD data compressing apparatus according to an embodiment of the present invention;

FIG. 8 is a schematic diagram showing the data structure of a repetitive pattern that is repeated 1024 times generated in the case that the CAD data compressing method according to the embodiment of the present invention is not applied;

FIG. 14 is a schematic diagram showing the data structure of a file having a plurality of regions corresponding to types of data of reference destinations identified by an identifier contained in a figure as a reference destination, the file being generated by the CAD data compressing method according to the embodiment of the present invention;

FIG. 17 is a schematic diagram showing a screen displayed by a displaying means in that case that the user designates a pattern group from the compression object shown in FIG. 16 using the displaying means and a region designating means according to the embodiment of the present invention;

FIG. 18 is a schematic diagram showing a display screen corresponding to CAD data in the case that a part of repetitive pattern intervals is irregular;

DESCRIPTION OF PREFERRED EMBODIMENTS

To solve the disadvantages of the prior art references, the present invention has the following features.

Figure 2:
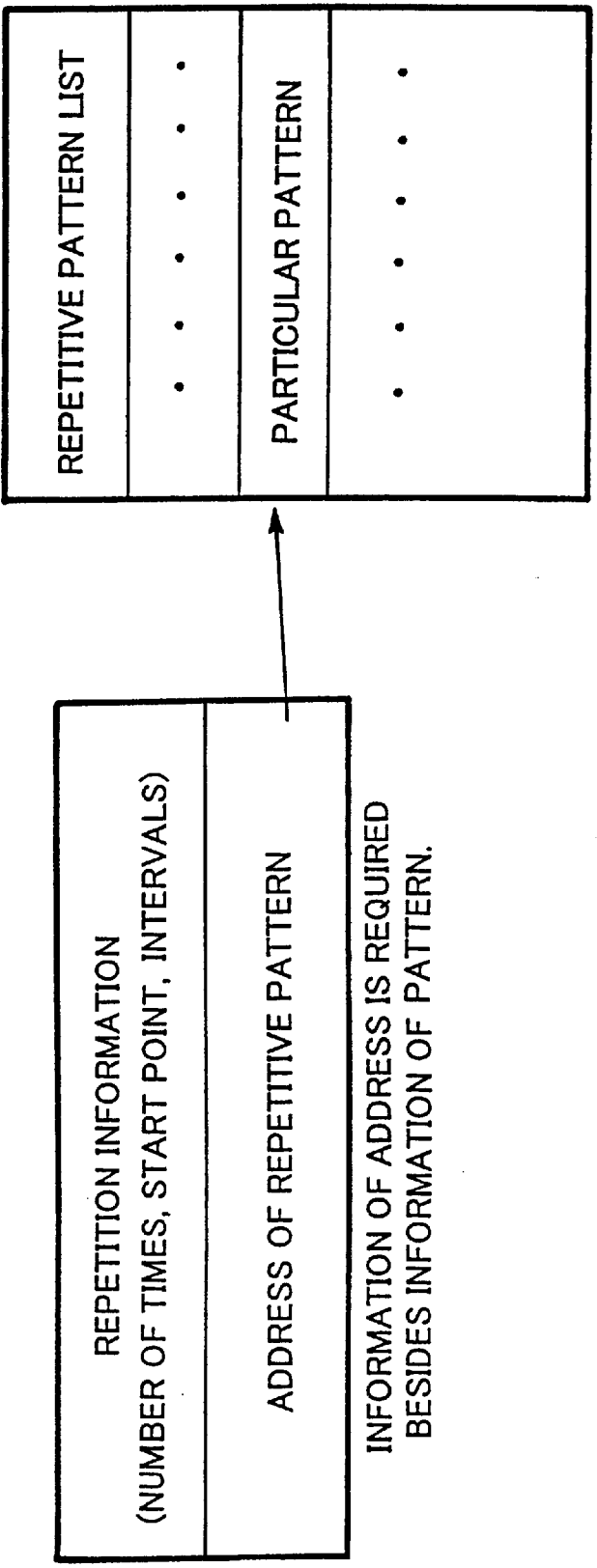
FIG. 2 is a schematic diagram for explaining a third problem of prior art references.
Figure 5:
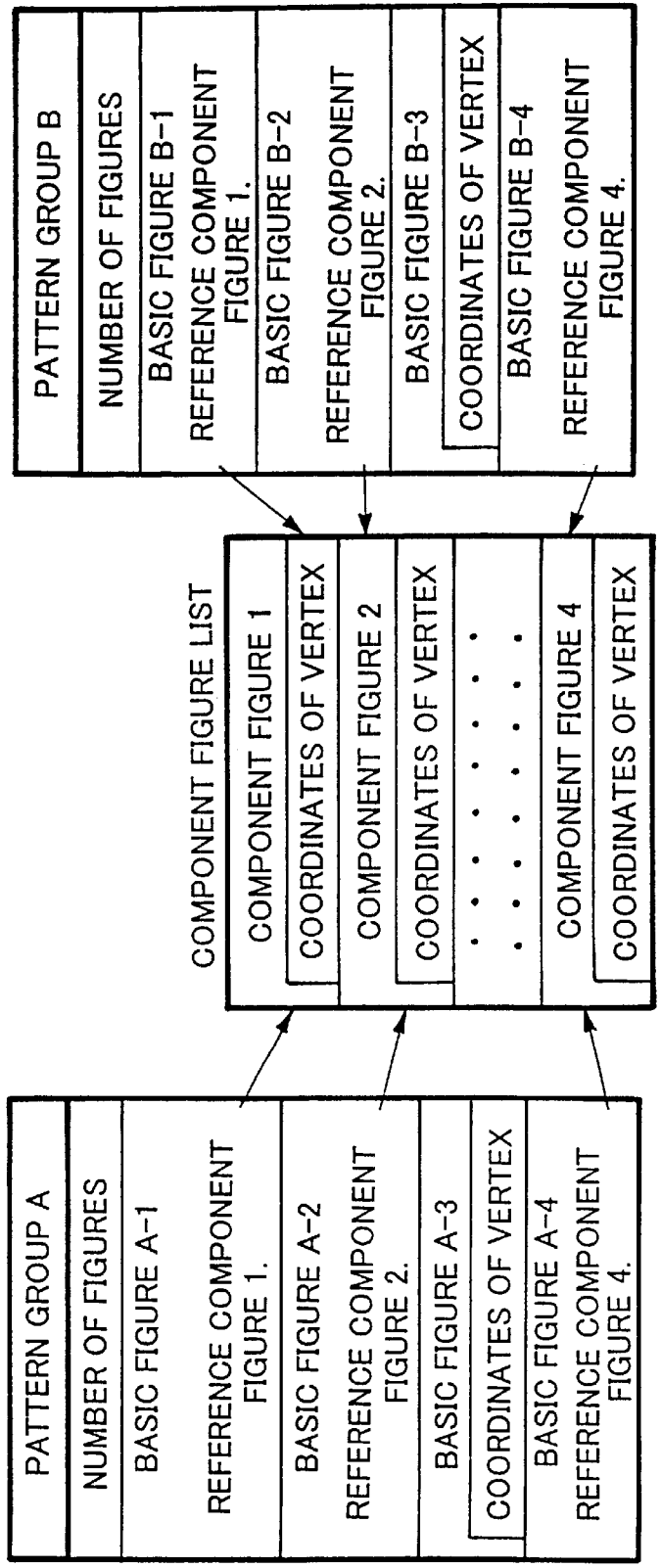
FIG. 5 is a schematic diagram showing the structure of CAD data of which data of a pattern group generated by a CAD data compressing method according to the embodiment of the present invention contains a pointer to a common component figure in a common component figure list.
Figure 6:
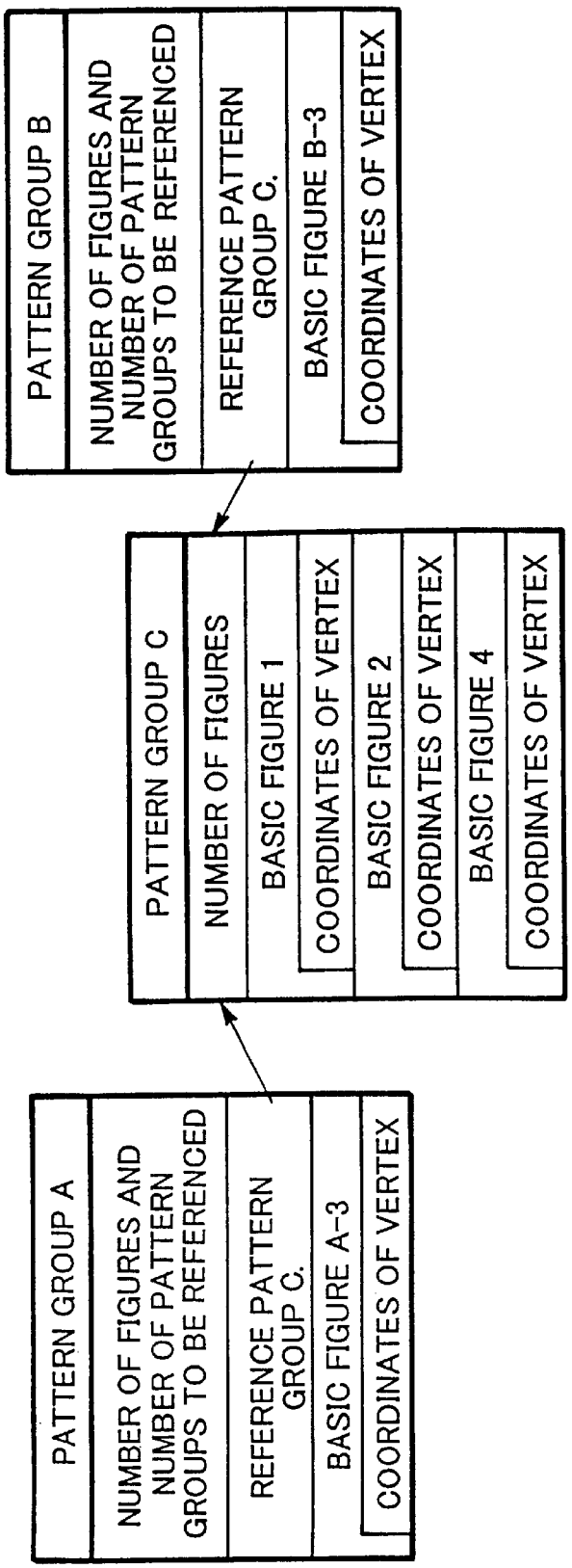
FIG. 6 is a schematic diagram showing the structure of CAD data of which data of a pattern group generated by the CAD data compressing method according to the embodiment of the present invention contains a pointer to a common pattern group.

(1) When a part of basic figures in a pattern group is the same as a part of basic figures in another pattern group, the common basic figures are registered as component figures and respective patter groups reference the component figures with pointers. For example, in FIG. 1, since A-1 and B-1 are the same figures; A-2 and B-2 are the same figures; and A-4 and B-4 are the same figures, such common figures are registered with a list as component figures as shown in FIG. 5. Thereafter, the list is referenced. Alternatively, only common patterns are registered as another pattern group as shown in FIG. 6. Thereafter, the pattern group is referenced.

Even in a case where a single figure is repeated, if the shape of the repetitive figure is the same as the shape of a component figure registered with a list, the list is referenced. Thus, the compression ratio will improve.

(2) If an isolated figure that is not repeated is a single figure that is not referenced a number of times, vertex data is described. If an isolated figure that is not repeated is referenced from different positions a number of times, the isolated figure is registered with a list as a component figure. Data of each of isolated figures contains a pointer to the component figure registered with the list instead of vertex coordinates.

Figure 7:
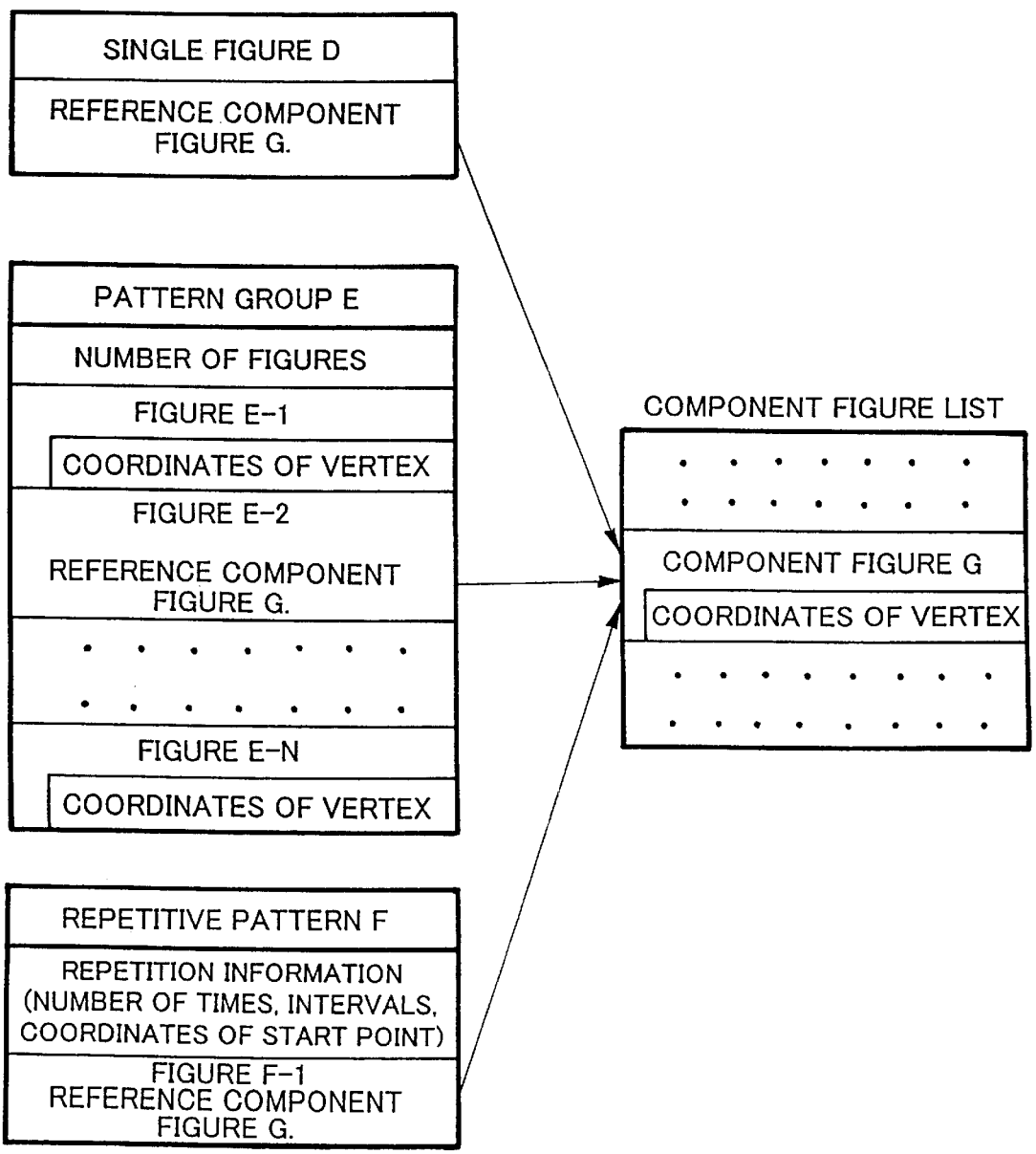
FIG. 7 is a schematic diagram showing the structure of CAD data having single figure data, pattern group data, and repetitive pattern data generated by the CAD data compressing method according to the embodiment of the present invention contain a pointer to a component figure in a component figure list.

In three cases, that is, in a case where the shape of an isolated figure that is not repeated is the same as the shape of a figure contained in an isolated pattern group that is not repeated, in a case where the shape of an isolated figure that is not repeated is the same as the shape of a single figure that is repeatedly referenced, and in a case where the shape of an isolated figure that is not repeated is the same as the shape of a basic figure in a pattern group repeatedly referenced, the isolated figure is registered with a list as a component figure. Thereafter, the list is referenced. Thus, the data compression ratio will improve (see FIG. 7).

(3) If a figure, a pattern group, or a repetitive pattern that is referenced about once is not registered with a list. Instead, the figure, the pattern group, or the repetitive pattern and directly stored to a file.

Figure 9:
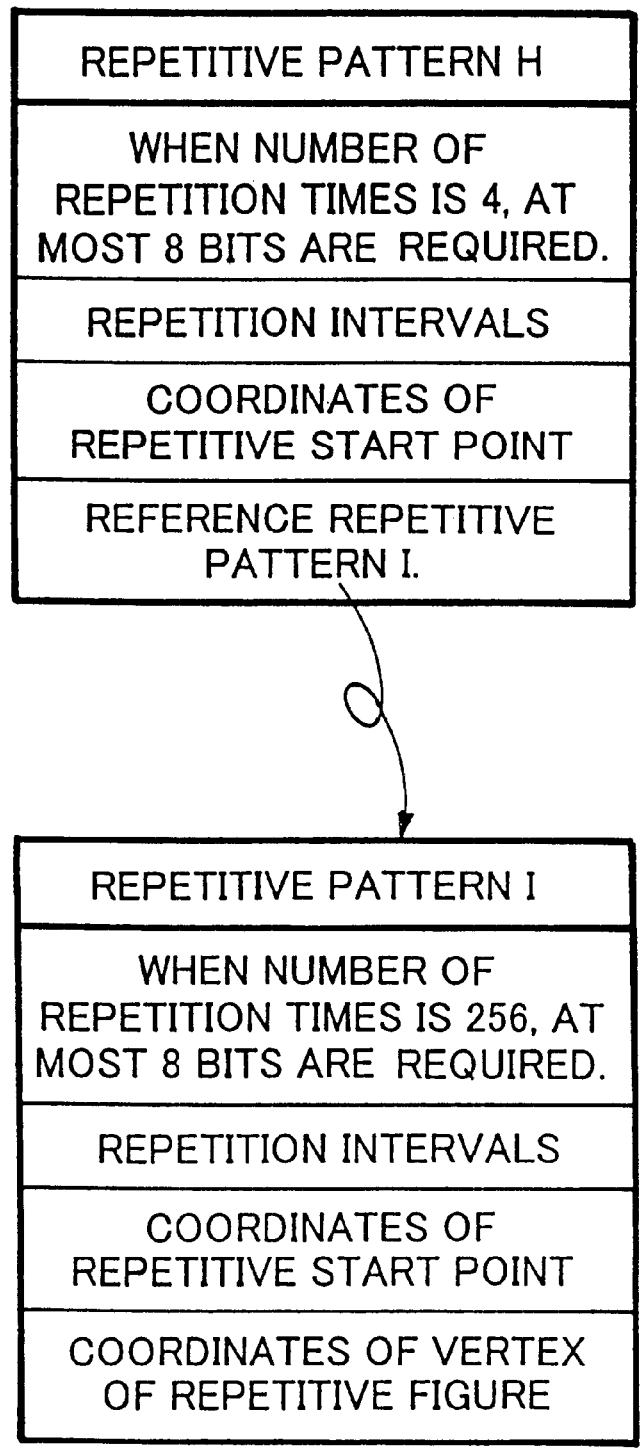
FIG. 9 is a schematic diagram showing the data structure of a repetitive pattern generated by the CAD data compressing method according to the embodiment of the present invention in the case that the number of repetition times is divided by a predetermined number.

(4) A pattern that is repeated a small number of repetitive times is registered as a repetitive pattern. When the repetitive pattern is referenced, the number of bits allocated to information that represents the number of repetition times can be decreased. For example, 10 bits are required for the information that represents the number of repetition times for a repetitive pattern that is repeated 1024 times as shown in FIG. 8. On the other hand, if a repetitive pattern that is repeated 256 times is referenced 4 times, the information that represents the number of repetition times can be decreased to 8 bits at most as shown in FIG. 9. In the example, it is assumed that the number of repetition times is any integer greater than zero. Although the number of repetitive patterns increases, if there are 1000 repetitive patterns whose number of repetition times is expressed with 8 bits or less, the data amount allocated to the information that represents the number of repetition times per pattern is at most 8 bits. Thus, data of 2×1000 bits can be reduced in comparison with the case that 10 bits are allocated to the information that represents the number of repetition times.

Figures 10, 11:
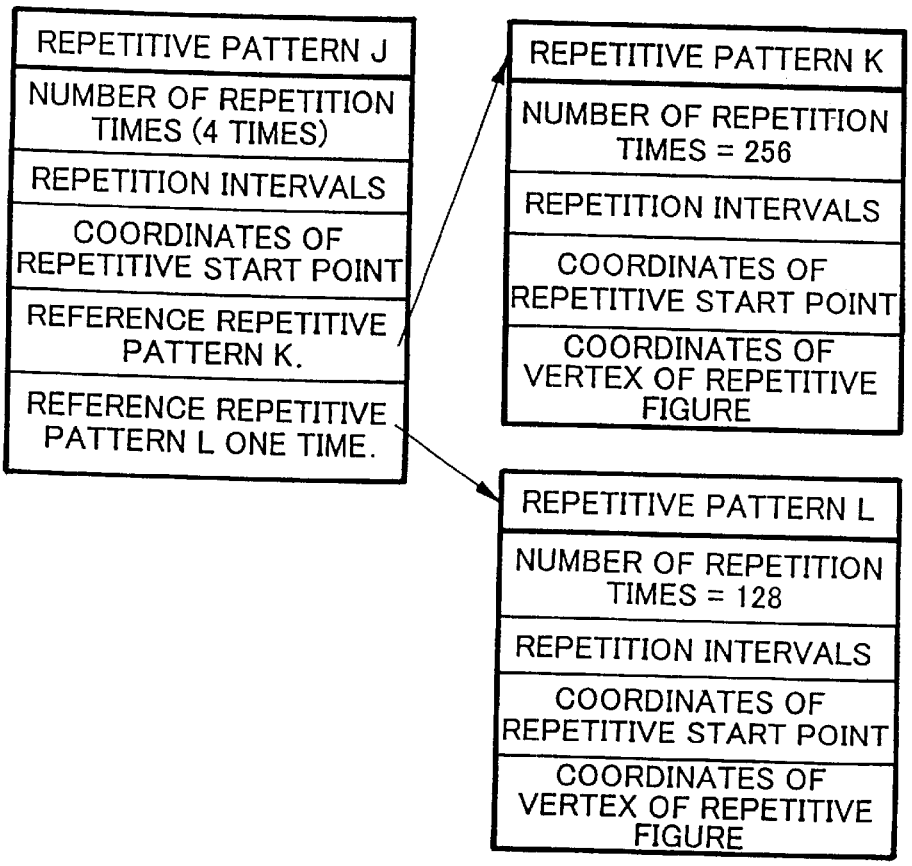
FIG. 10 is a schematic diagram showing the data structure of a repetitive pattern that is repeated 1152 times and that is generated in the case that the CAD data compressing method according to the present invention is not applied.
FIG. 11 is a schematic diagram showing the data structure of a repetitive pattern of which the number of repetition times cannot be divided by a predetermined number and that is generated corresponding to the CAD data compressing method of the embodiment of the present invention.

If the number of repetition times of a desired wide region cannot be divided by the number of repetition times of a registered pattern that is repeated a small number of times, the region is separated to a dividable region and a remainder region. For example, if a repetitive pattern is repeated 1152 times as shown in FIG. 10, a repetitive pattern that is repeated 256 times is referenced four times. In addition, a repetitive pattern that is repeated 128 times is referenced one time as shown in FIG. 11). In the example, although the number of bits allocated to information that represents the number of repetition times of a repetitive pattern that is repeated 256 times is the same as the number of bits allocated to information that represents the number of repetition times of a repetitive pattern that is repeated 128 times as a fundamental rule, different bits may be allocated thereto as an exception.

Figure 12:
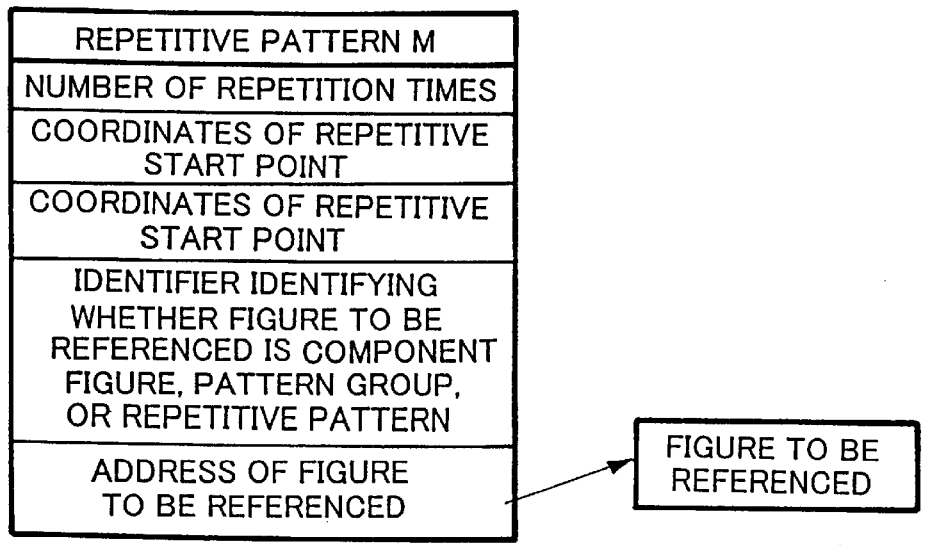
FIG. 12 is a schematic diagram showing the data structure of a repetitive pattern generated corresponding to the CAD data compressing method according to the present invention and the data structure of a figure referenced by the repetitive pattern, an identifier being contained in the repetitive pattern, the identifier representing the type of data of the figure as the reference destination.
Figure 13:
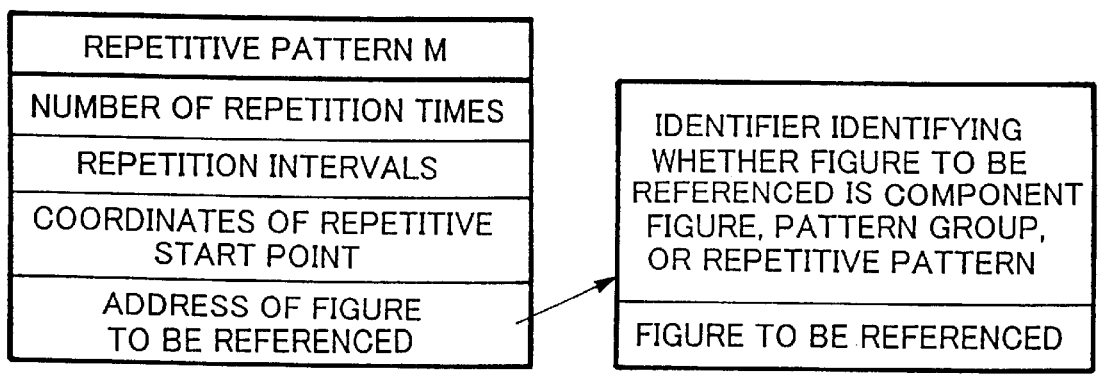
FIG. 13 is a schematic diagram showing the data structure of a repetitive pattern generated corresponding to the CAD data compressing method according to the present invention and the data structure of a figure referenced by the repetitive pattern, an identifier being contained in the figure, the identifier representing the type of data of the figure as the reference destination.

(5) An identifier that identifies whether referenced in a repetitive loop is a component figure registered with a list, a single figure that is not registered with a component figure list, a pattern group composed of a plurality of figures, or a repetitive pattern is added to a reference source as shown in FIG. 12. Alternatively, the identifier is added at the beginning of a pattern that is referenced as shown in FIG. 13. Alternatively, the type of data of a reference destination may be identified with an address. For example, when the address of a reference destination is a particular address, it may identify a component figure (see FIG. 14). Alternatively, a component figure list, a single figure list, a pattern group list, and a repetitive pattern list may be separately stored in respective files. Thereafter, those files are referenced (see FIG. 15).

When a pattern group is referenced, the number of figures that constitute the pattern group should be described. When a repetitive pattern is referenced, the number of repetition times should be described.

Even if an isolated pattern that is not repeated is referenced, an identifier that identifies whether the isolated pattern is a component figure, a single figure that is not registered with a component figure list, or a pattern group composed of a plurality of figures should be added. Alternatively, the type of the isolated pattern should be identified corresponding to an address. Alternatively, a component figure list, a single figure list, a pattern group list, and a repetitive pattern list are separately stored to respectively files. Thereafter, those files are referenced.

Figure 16:
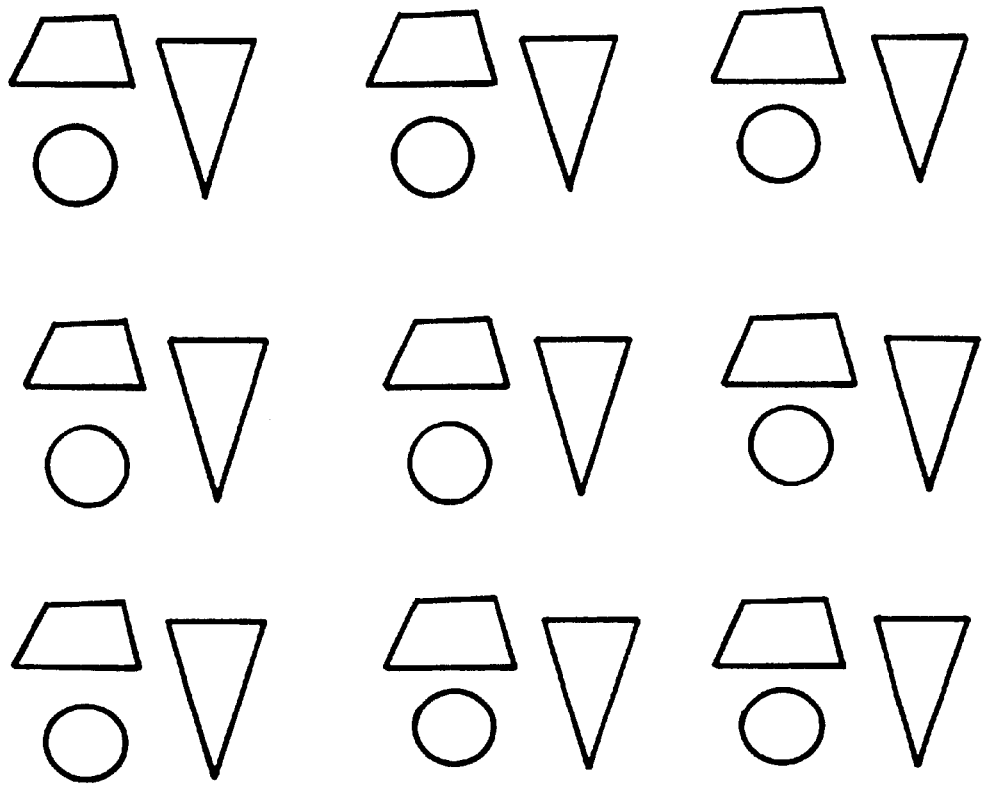
FIG. 16 is a schematic diagram showing an example of a compression object having a plurality of pattern groups that are the same, the compression object being compressed by the CAD data compressing method according to the embodiment of the present invention.

(6) A pattern group is not only automatically designated corresponding to repetitive data of CAD data but also manually designated through an interface that allows the user to manually designate a set of figures as a pattern group corresponding to a repetitive state of CAD patterns graphically displayed on a browser. For example, when a pattern composed of a plurality of figures is repeated as shown in FIG. 16, the user can designate a pattern group with a mouse as shown in FIG. 17. The designated region is converted into CAD coordinate system so as to designate the designated pattern group.

When the user visually designates a pattern group, he or she may mistake it. For example, there are a case where repetition intervals of a pattern group slightly differ depending on figures and a case where what seems to be repeated pattern groups is slightly different from repeated pattern groups. In order to cope with such cases, whether the pattern group that is considered to be repeated is regularly repeated in reality is determined by checking information with respect to the positions and shapes of figures in CAD data.

Figure 19:
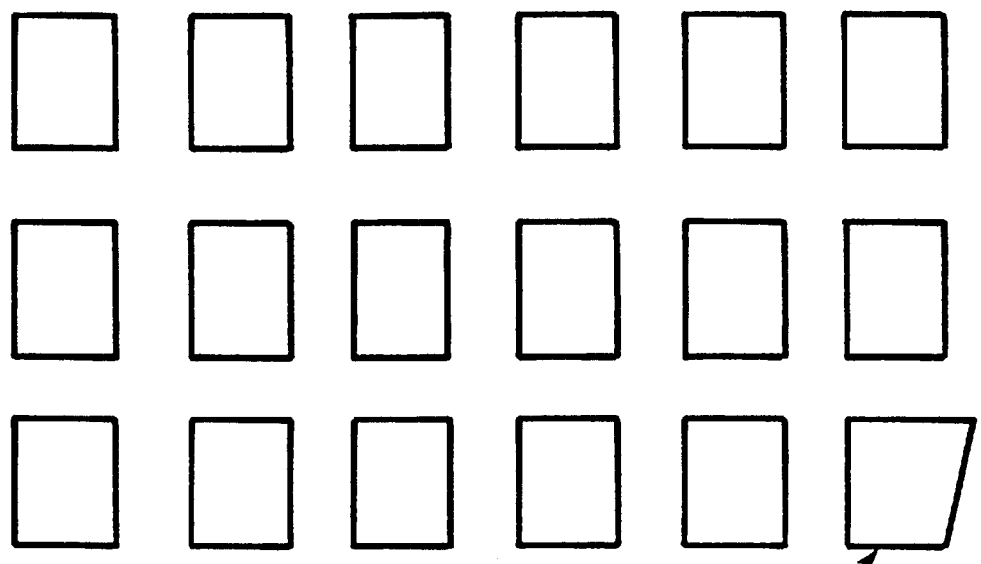
FIG. 19 is a schematic diagram showing a display screen corresponding to CAD data in the case that a particular part of a repetitive pattern is different from other figures.

(7) Whether a figure is repeated is not only automatically designated corresponding to repetition information in CAD data but also designated by graphically displaying CAD pattern and manually designating a pattern which should be an element to be repeated and a range where the pattern repeats. However, there is a case where the regularity of figures that are considered to be repeated breaks slightly. For example, there are a case where a distance between figures which is considered to be the same as the distances between the other figures is slightly different from the distances between the other figures in reality as shown in FIG. 18 and a case where a figure which is considered to be the same as the other figures is slightly different from the other figures as in reality shown in FIG. 19. In order to cope with such cases, whether the pattern group that is considered to be repeated is regularly repeated in reality is determined by checking information with respect to the positions and shapes of figures in CAD data.

Next, with reference to FIG. 4, the structure of the CAD data compressing apparatus according to the embodiment of the present invention will be explained.

The CAD data compressing apparatus comprises an input means 101, a displaying means 102, a region designating means 103, a pattern group registering means 104, a repetitive element registering means 105, a repetition region registering means 106, a repetition interval determining means 107, a pattern sameness determining means 108, a repetitive pattern registering means 109, a "number of repetition times" determining means 110, a repetitive pattern separating means 111, an identifier adding means 112, a "number of reference times" measuring means 113, a reference information registering means 114, a reference destination designating means 115, and an output means 116. The input means 101 inputs CAD data. The displaying means 102 graphically displays CAD data. The region designating means 103 allows the user to manually designate a region of the displayed CAD data. The pattern group registering means 104 automatically registers a pattern group corresponding to a user's command or coordinate values of figures in CAD data. The repetitive element registering means 105 registers a basic figure as a repetitive element corresponding to a user's command or coordinate values of figures in CAD data. The repetition region registering means 106 registers a repetition region corresponding to a user's command or coordinate values of figures in CAD data. The repetition interval determining means 107 determines whether or not repetition intervals of a repetitive element are constant. If the repetition intervals are not constant, the repetition interval determining means 107 issues an alarm to the user. The pattern sameness determining means 108 determines whether or not figures, pattern groups, or repetitive patterns that seem to be repetitive elements are the same. If the figures, pattern groups, or repetitive patterns are not the same, the pattern sameness determining means 108 issues an alarm to the user. The repetitive pattern registering means 109 registers a repetitive pattern. The "number of repetition times" determining means 110 determines whether or not the number of repetition times of a repetitive figure exceeds a predetermine value. If the number of repetition times of a repetitive figure exceeds the predetermine value, the repetitive pattern separating means 111 changes the data structure of the repetitive pattern so that a repetitive pattern whose number of repetition times does not exceeds the predetermined value is repetitively referenced. The identifier adding means 112 adds an identifier to a figure, a pattern group, a repetitive pattern, or repetition information such as the number of repetition times, intervals, or start point. The "number of reference times" measuring means 113 measures the number of reference times of a figure, a pattern group, a repetitive pattern, or repetition information. If the number of reference times is less than the predetermined value, the reference information registering means 114 stores the figure or the like to the file. If the number of reference times exceeds the predetermined value, the reference information registering means 114 register the figure or the like with a list. If the same figure, the same pattern group, the repetitive pattern, or the same repetition information is referenced from different positions, the reference destination designating means 115 designates a reference destination so that the same address on the list thereof is referenced. The output means 116 outputs a figure, a pattern group, a repetitive pattern, and repetition information together to a file or the like.

Next, with reference to FIG. 4, the operation of the CAD data compressing apparatus according to the embodiment of the present invention will be explained.

The input means 101 inputs CAD data. Generally, CAD data is represented as a set of vertex coordinates of a component figure.

The displaying means 102 graphically displays CAD data. CAD data is displayed on a screen of, for example, a computer display device or a liquid crystal projector. The user can freely designate a display magnification of the CAD data.

The region designating means 103 allows the user to manually designate a region which will be a target to be compressed. The user can designate a rectangle region with for example a computer mouse.

The pattern group registering means 104 treats a plurality of figures contained in the region designated by the user with the mouse or corresponding to coordinate values that is input by the user with the keyboard as a pattern group and stores the pattern group to a file as shown in FIG. 3.

If a plurality of figures are repetitively described, the pattern group registering means 104 automatically registers the figures as a pattern group to the file. If figures have the same repetition intervals, the same repetitive number of times, and almost the same repetitive start coordinate values, the pattern group registering means 104 registers those figures as one pattern group.

The repetitive element registering means 105 stores a figure contained in a region designated by the user with the mouse or corresponding to a coordinate value that is input by the user with the keyboard as a repetitive element. Alternatively, the repetitive element registering means 105 searches CAD data for figures whose shape is the same and whose intervals are constant. When such figures are obtained, the repetitive element registering means 105 automatically stores the figures as repetitive elements.

The repetition region registering means 106 stores a region designated by the user with the mouse or corresponding to a coordinate value that is input by the user with the keyboard as a repetition region. Alternatively, the repetition region registering means 106 automatically stores a region in which there are figures whose shapes are the same and whose intervals are constant as a repetition region.

The repetition interval determining means 107 determines whether or not the repetition intervals of a repetitive element are constant in the repetition region on the basis of to coordinate value data of CAD data. When the repetition intervals are not constant, the repetition interval determining means 107 issues an alarm to the user using a buzzer, an alarm message on the display device, or the like.

The pattern sameness determining means 108 determines whether or not figures, pattern groups, or repetitive patterns that seem to be repetitive elements are the same on the basis of coordinate values of CAD data. When they are not the same, the pattern sameness determining means 108 issues an alarm to the user using a buzzer, an alarm message on the display device, or the like.

If the repetition interval determining means 107 and the pattern sameness determining means 108 have not issued an alarm for a pattern to the user, the repetitive pattern registering means 109 registers the pattern as a repetitive pattern with a file as shown in FIG. 3.

The "number of repetition times" determining means 110 determines whether or not the number of repetition times of a repetitive figure exceeds a predetermined value.

If the number of repetition times exceeds the predetermined value as the determined result of the "number of repetition times" determining means 110, the repetitive pattern separating means 111 changes the data structure of the repetitive pattern so that a repetitive pattern whose number of repetition times does not exceed the predetermined value is referenced. For example, a repetitive pattern that references the same pattern 1024 times as shown in FIG. 8 is separated so that a first repetitive pattern references a second repetitive pattern 4 times and the second repetitive pattern references the same pattern 256 times. For another example, when the same pattern is referenced 1152 times as shown in FIG. 10, a first repetitive pattern references a second repetitive pattern 4 times and a third repetitive pattern once, the second repetitive pattern references the same pattern 256 times, and the third repetitive pattern references the same pattern 128 times.

Figure 15:
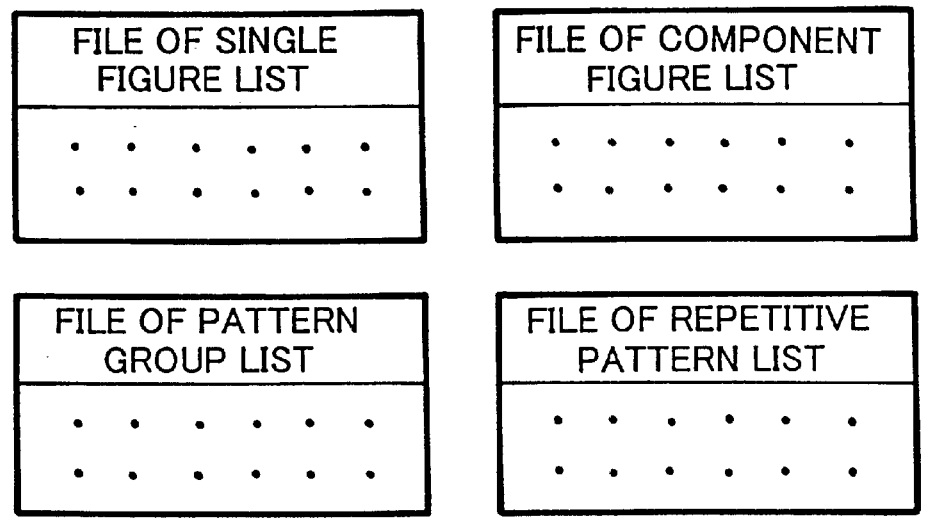
FIG. 15 is a schematic diagram showing a plurality of files corresponding to types of data of reference destinations identified by an identifier contained in a figure as a reference destination, the files being generated corresponding to the CAD data compressing method according to the embodiment of the present invention.

The identifier adding means 112 adds an identifier to a figure, a pattern group, a repetitive pattern, and repetition information such as the number of repetition times, intervals, and start points. When the number of types of information amount to be identified is four, data of 2 bits such as 0×00, 0×01, 0×10, and 0×11 are required. The identifier may be added to a reference source when referenced as shown in FIG. 12 or to data of a reference destination as shown in FIG. 13. Alternatively, unique addresses corresponding to types of data may be designated as shown in FIG. 14. Alternatively, individual types of data may be stored to respective files as shown in FIG. 15.

The "number of reference times" measuring means 113 measures and stores the number of reference times of a figure, a pattern group, a repetitive pattern, or repetition information.

If the number of reference times obtained by the "number of reference times" measuring means 113 is less than the predetermined value, the reference information registering means 114 adds a predetermined identifier to the compression object and stores the resultant object to the file. For example, individual types of information to be referenced are stored as shown in FIG. 3. When the number of reference times exceeds the predetermined value, the list of reference data is registered. When the compression object is a component figure, it is registered in the format of the component figure list shown in FIG. 5.

The reference destination designating means 115 compares the shapes and repetition information of figures that have been registered. When the same shape and the same repetition information are obtained, the reference destination designating means 115 unifies the figures together. At that point, the reference destination designating means 115 corrects reference destinations so that corrected reference destinations point to the address of the unified object.

The output means 116 outputs the lists of figures, pattern groups, repetitive patterns, and repetitive information to a single file or respective files.

As long as the following restrictions are kept, the order of means 101 is to 116 can be changed.

The input means 101 should be located at the first stage.

The output means 116 should be located at the final stage.

The displaying means 102 should be followed by the region designating means 103.

The region designating means 103 should be followed by the pattern group registering means 104, the repetitive element registering means 105, and the repetition region registering means 106.

The repetitive element registering means 105 and the repetition region registering means 106 should be followed by the repetition interval determining means 107, the "number of repetition times" determining means 110, and the pattern sameness determining means 108.

The repetition interval determining means 107 and the pattern sameness determining means 108 should be followed by the repetitive pattern registering means 109.

The "number of repetition times" determining means 110 should be followed by the repetitive pattern separating means 111.

The "number of reference times" measuring means 113 should be followed by the reference information registering means 114.

The reference information registering means 114 should be followed by the reference destination designating means 115.

The CAD data compressing apparatus that accomplishes the above-mentioned CAD data compressing method may be realized on a computer.

Figure 20:
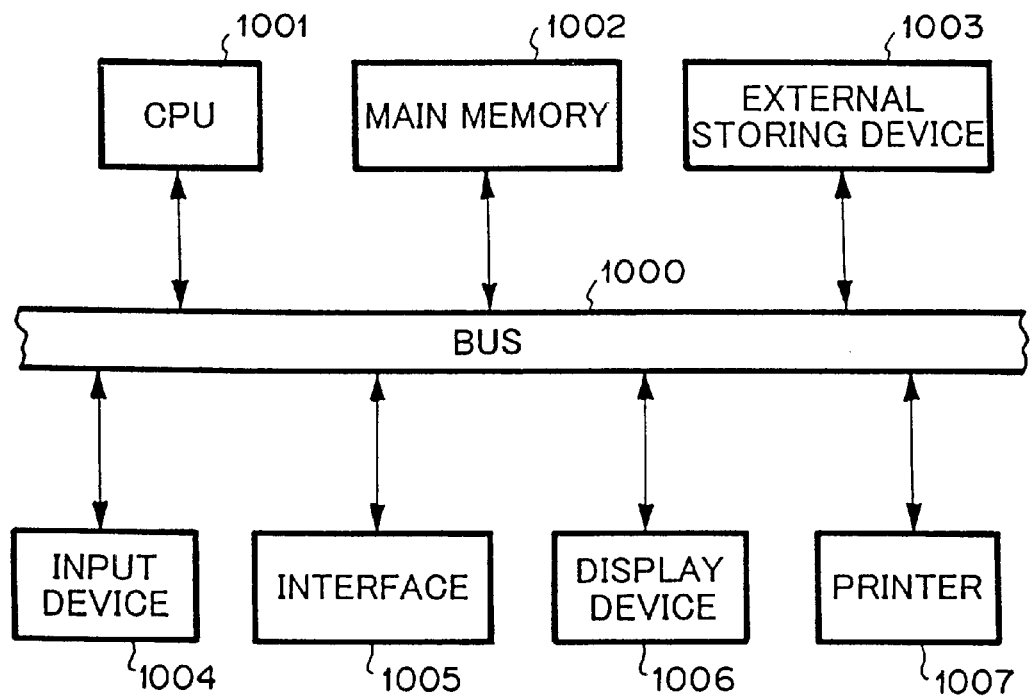
FIG. 20 is a block diagram showing the structure of a CAD data compressing apparatus composed of a computer according to the embodiment of the present invention.

With reference to FIG. 20, the computer that constitutes the CAD data compressing apparatus comprises a CPU 1001, a main memory 1002, an external storing device 1003, an input device 1004, an interface 1005, a display device 1006, a printer 1007, and a bus 1000 connecting these devices.

The CPU 1001 is, for example, a microprocessor, a microcomputer, or a DSP. The main memory 1002 is, for example, a RAM. The external storing device 1003 is, for example, a hard drive, an optical disc, or a magneto-optical disc. The input device 1004 is, for example, a mouse, a keyboard, and/or a data tablet. The interface 1005 is a communication information connected to, for example, a web server. The display device 1006 is for example a CRT or an LCD.

The CPU 1001 executes instructions in a computer program so that the CPU 1001 functions as the input means 101, the region designating means 103, the pattern group registering means 104, the repetitive element registering means 105, the repetition region registering means 106, the repetition interval determining means 107, the pattern sameness determining means 108, the repetitive pattern registering means 109, the "number of repetition times" determining means 110, the repetitive pattern separating means 111, the identifier adding means 112, the "number of reference times" measuring means 113, the reference information registering means 114, the reference destination designating means 115, and the output means 116. These functions accomplish the above-explained compressing method. The display device 1006 is equivalent to the displaying means 102. The above-explained computer program is pre-stored in the external storing device 1003. When the program is executed, the CPU 1001 loads the program to the main memory 1002 so as to fetch instructions of the program.

The input means 101 reads CAD data from a data file stored in the external storing device 1003. The output means 116 writes a file containing the compressed data to the external storing device 1003.

As was explained above, the present invention takes the following effects.

(1) If the shapes of basic figures as structural elements of a plurality of pattern groups are the same, the figures are registered as component figures. Each pattern group references the component figures with a pointer or the like. Thus, since the same data is prevented from being redundantly registered, the data compression ratio will improve.

Even if a single figure is repeated, when the shape of the repetitive figure is the same as the shape of a component figure registered with a list, the list is referenced. Thus, the compression ratio will improve.

(2) Since an isolated figure that is not repeated is registered as a component figure with a list, the data compression ratio will improve.

(3) A figure, a pattern group, or a repetitive pattern that is referenced about once is not registered with a list. Instead, the figure, the pattern group, or the repetitive pattern is directly stored to a file. Thus, the data compression ratio can be prevented from deteriorating.

(4) A pattern that is repeated a small number of repetition times is registered as a repetitive pattern, and then the repetitive pattern is referenced. Therefore, the number of bits allocated to information that represents the number of repetition times can be decreased. Thus, the data compression ratio will improve.

(5) An identifier that identifies whether referenced in a repetition loop is a component figure registered with a list, a single figure that is not registered with a component figure list, a pattern group composed of a plurality of figures, or a repetitive pattern is added. Thus, data can be correctly developed.

Even for an isolated pattern that is not repeated, an identifier that identifies whether the isolated pattern is a component figure, a single figure that is not registered with a component figure list, or a pattern group composed of a plurality of figures is added. Thus, data can be correctly decompressed.

(6) Since the user can manually designate a pattern group, the time necessary for searching for figures which constitute a certain pattern group can be remarkably reduced.

(7) In a case where it is determined whether or not a certain figure is repeated, the user can manually designate a pattern element that becomes a repetitive element and the repetition region. Thus, the time necessary for searching for a repetitive element and a repetition region can be remarkably reduced.

Although the present invention has been shown and explained with respect to the best mode embodiment thereof, it should be understood by those skilled in the art that the foregoing and various other changes, omissions, and additions in the form and detail thereof may be made therein without departing from the spirit and scope of the present invention.

What is claimed is:

1. A method of compressing computer aided design (CAD) data representing a design, comprising:

generating a component figure list comprising component figures of said design; and generating pattern group data for pattern group of said design, said pattern group data comprising pointers to component figures in said component figure list for component figures of said pattern group, wherein at least one of the component figures is referred from plurality of pointers.

2. The data compressing method as set forth in claim 1, further comprising:

generating single figure data for repeated component figures of said design, said single figure data comprising pointers to said repeated component figures included in said component figure list, wherein at least one of the repeated component figures is referred from a plurality of pointers.

3. A method for compressing computer aided design (CAD) data representing a design, comprising:

generating common pattern group data for a common pattern group of said design, said common pattern group comprising a pattern of figures common to a plurality of pattern groups of said design; and generating pattern group data for said pattern groups of said design that include said common pattern group, the pattern group data for each of said pattern groups comprising a pointer to said common pattern group data, wherein said common pattern group data is referred from a plurality of pointers.

4. A method for compressing computer aided design (CAD) data representing a design, comprising:

generating a component figure list comprising component figures of said design; and generating isolated figure data for one or more isolated figures of said design, said isolated figure data comprising one or more pointers to a component figure in said component figure list.

5. A method for compressing computer aided design (CAD) data representing a design, comprising:

generating a component figure list comprising component figures of said design;

generating isolated figure data for an isolated figure of said design, said isolated figure data comprising a pointer to a specific component figure in said component figure list;

generating pattern group data for a pattern group of said design, said pattern group data comprising a pointer to the specific component figure in said component figure list for component figures of said pattern groups; and generating repetitive pattern data for a repetitive pattern group of said design, said repetitive pattern data comprising a pointer to the specific component figure in said component figure list for a component figure of said repetitive pattern group, wherein the specific component figure is referred from a plurality of pointers.

6. A method for compressing computer aided design (CAD) data representing a design, comprising:

generating data of a first repetitive pattern of said design whose number of repetition times is represented by a predetermined number of bits; and generating data of a second repetitive pattern of said design comprising repetitions of said first repetitive pattern, said second repetitive pattern data comprising a pointer to said first repetitive pattern data.

7. A method for compressing computer aided design (CAD) data representing a design, comprising:

generating data of a first repetitive pattern of said design whose number of repetition times is represented by a first predetermined number of bits;

generating data of a second repetitive pattern of said design whose number of repetition times is represented by one of the first predetermined number of bits and a second predetermined number of bits; and generating data of a third repetitive pattern of said design comprising repetitions of said first repetitive pattern and said second repetitive pattern, said third repetitive pattern data comprising a pointer to said first repetitive pattern data and a pointer to said second repetitive pattern data.

8. A method for compressing computer aided design (CAD) data representing a design, comprising:

generating first data representing one of a component figure, a single figure, a pattern group, and a repetitive pattern of said design; and generating repetitive pattern data for a repetitive pattern of said design comprising one of said component figure, single figure, pattern group, and repetitive pattern of said design, said repetitive pattern data comprising a pointer to said first data and an identifier indicating whether said first data which is pointed to by said pointer represents said component figure, said single figure, said pattern group, or said repetitive pattern.

9. A method for compressing computer aided design (CAD) data representing a design, comprising:

generating a set of first data representing one of a component figure, a single figure, a pattern group, and a repetitive pattern of said design, said first set of data comprising an identifier indicating whether said set of first data represents said component figure, said single figure, said pattern group, or said repetitive pattern; and generating repetitive pattern data for a repetitive pattern of said design comprising one of said component figure, single figure, pattern group, and repetitive pattern, said repetitive pattern data comprising a pointer to said first set of data.

10. A method for compressing computer aided design (CAD) data representing a design, comprising:

generating first data representing one of a component figure, a single figure, a pattern group, and a repetitive pattern of said design in one of designated regions for a component figure, a single figure, a pattern group, and a repetitive pattern; and generating repetitive pattern data for a repetitive pattern of said design, said repetitive pattern data comprising a pointer to said first data.

11. A method for compressing computer aided design (CAD) data representing a design, comprising:

generating first data representing one of a component figure, a single figure, a pattern group, and a repetitive pattern of said design in one of designated files for a component figure, a single figure, a pattern group, and a repetitive pattern; and generating repetitive pattern data for a repetitive pattern of said design, said repetitive pattern data comprising a pointer to said first data.

12. A method for compressing computer aided design (CAD) data representing a design, comprising:

selecting a repetitive pattern group from an input figure group corresponding to a user's operation of an input device; and determining whether or not the selected pattern group is regularly repeated in CAD data that is provided as an input compression source.

13. The method as set forth in claim 12, further comprising:

selecting a region in which to determine whether or not the selected pattern group is regularly repeated corresponding to the user's operation of the input device.

14. An apparatus for compressing computer aided design (CAD) data representing a design, comprising:

means for generating a component figure list comprising component figures of said design; and means for generating pattern group data for a pattern group of said design, said pattern group data comprising pointers to component figures in said component figure list for component figures of said pattern group, wherein at least one of the component figures is referred from a plurality of pointers.

15. The apparatus as set forth in claim 14, further comprising:

means for generating single figure data for repeated component figures of said design, said single figure data comprising pointers to said repeated component figures included in said component figure list, wherein at least one of the repeated component figures is referred from a plurality of pointers.

16. An apparatus for compressing computer aided design (CAD) data representing a design, comprising:

means for generating common pattern group data for a common pattern group of said design, said common pattern group comprising a pattern of figures common to a plurality of pattern groups of said design; and means for generating pattern group data for said pattern groups of said design that include said common pattern group, the pattern group data for each of said pattern groups comprising a pointer to said common pattern group data, wherein said common pattern group data is referred from a plurality of figures.

17. An apparatus for compressing computer aided design (CAD) data representing a design, comprising:
means for generating a component figure list comprising component figures of said design; and
means for generating isolated figure data for one or more isolated figures of said design, said isolated figure data comprising one or more pointers to a component figure in said component figure list.

18. An apparatus for compressing computer aided design (CAD) data representing a design, comprising:
means for generating a component figure list comprising component figures of said design;
means for generating isolated figure data for an isolated figure of said design, said isolated figure data comprising a pointer to a specific component figure in said component figure list;
means for generating pattern group data for a pattern group of said design, said pattern group data comprising a pointer to the specific component figure in said component figure list for a component figure of said pattern group; and
means for generating repetitive pattern data for a repetitive pattern group of said design, said repetitive pattern data comprising a pointer to the specific component figure in said component figure list for a component figure of said repetitive pattern group,
wherein the specific component figure is referred from a plurality of pointers.

19. An apparatus for compressing computer aided design (CAD) data representing a design, comprising:
means for generating data of a first repetitive pattern of said design whose number of repetition times is represented by a predetermined number of bits; and
means for generating data of a second repetitive pattern of said design comprising repetitions of said first repetitive pattern, said second repetitive pattern data comprising a pointer to said first repetitive pattern data.

20. An apparatus for compressing computer aided design (CAD) data representing a design, comprising:
means for generating data of a first repetitive pattern of said design whose number of repetition times is represented by a first predetermined number of bits;
means for generating data of a second repetitive pattern of said design whose number of repetition times is represented by one of the first predetermined number of bits and a second predetermined number of bits; and
means for generating data of a third repetitive pattern of said design comprising repetitions of said first repetitive pattern and said second repetitive pattern, said third repetitive pattern data comprising a pointer to said first repetitive pattern data and a pointer to said second repetitive pattern data.

21. An apparatus for compressing computer aided design (CAD) data representing a design, comprising:
means for generating first data representing one of a component figure, a single figure, a pattern group, and a repetitive pattern of said design; and
means for generating repetitive pattern data for a repetitive pattern of said design comprising one of said component figure, single figure, pattern group, and repetitive pattern of said design, said repetitive pattern data comprising a pointer to said first data and an identifier indicating whether said first data which is pointed to by said pointer represents said component figure, said single figure, said pattern group, or said repetitive pattern.

22. An apparatus for compressing computer aided design (CAD) data representing a design, comprising:
means for generating a set of first data representing one of a component figure, a single figure, a pattern group, and a repetitive pattern of said design, said first set of data comprising an identifier indicating whether said set of first data represents said component figure, said single figure, said pattern group, or said repetitive pattern; and
means for generating repetitive pattern data for a repetitive pattern of said design comprising one of said component figure, single figure, pattern group, and repetitive pattern, said repetitive pattern data comprising a pointer to said first set of data.

23. An apparatus for compressing computer aided design (CAD) data representing a design, comprising:
means for generating first data representing one of a component figure, a single figure, a pattern group, and a repetitive pattern of said design in one of designated regions for a component figure, a single figure, a pattern group, and a repetitive pattern; and
means for generating repetitive pattern data for a repetitive pattern of said design, said repetitive pattern data comprising a pointer to said first data.

24. An apparatus for compressing computer aided design (CAD) data representing a design, comprising:
means for generating first data representing one of a component figure, a single figure, a pattern group, and a repetitive pattern of said design in one of designated files for a component figure, a single figure, a pattern group, and a repetitive pattern; and
means for generating repetitive pattern data for a repetitive pattern of said design, said repetitive pattern data comprising a pointer to said first data.

25. A CAD data compressing apparatus, comprising:
means for selecting a repetitive pattern group from an input figure group corresponding to a user's operation of an input device; and
means for determining whether or not the selected pattern group is regularly repeated in CAD data that is provided as an input compression source.

26. The apparatus as set forth in claim 25, further comprising:
means for selecting a region in which to determine whether or not the selected pattern group is regularly repeated corresponding to the user's operation of the input device.

27. A computer readable medium having encoded therein programming instructions for a method for compressing computer aided design (CAD) data representing a design, the method comprising:
generating a component figure list comprising component figures of said design; and
generating pattern group data for a pattern group of said design, said pattern group data comprising pointers to component figures in said component figure list for component figures of said pattern group,
wherein at least one of the component figures is referred from a plurality of pointers.

28. The computer readable medium set forth in claim 27, wherein the method further comprises:
generating single figure data for repeated components of said design, said single figure data comprising pointers to said repeated component figures included in said component figure list, wherein at least one of the repeated component figures is referred from a plurality of pointers.

29. A computer readable medium having encoded therein programming instructions for a method for compressing computer aided design (CAD) data representing a design, the method comprising:

generating common pattern group data for a common pattern group of said design, said common pattern group comprising a pattern of figures common to a plurality of pattern groups of said design; and generating pattern group data for said pattern groups of said design that include said common pattern group, the pattern group data for each of said pattern groups comprising a pointer to said common pattern group data, wherein said common pattern group data is referred from a plurality of pointers.

30. A computer readable medium having encoded therein programming instructions for a method for compressing computer aided design (CAD) data representing a design, the method comprising:

generating a component figure list comprising component figures of said design; and generating isolated figure data for one or more isolated figures of said design, said isolated figure data comprising one or more pointers to a component figure in said component figure list.

31. A computer readable medium having encoded therein programming instructions for a method for compressing computer aided design (CAD) data representing a design, the method comprising:

generating a component figure list comprising component figures of said design;

generating isolated figure data for an isolated figure of said design, said isolated figure data comprising a pointer to a specific component figure in said component figure list;

generating pattern group data for a pattern group of said design, said pattern group data comprising a pointer to the specific component figure in said component figure list for a component figure of said pattern group; and generating repetitive pattern data for a repetitive pattern group of said design, said repetitive pattern data comprising a pointer to the specific component figure in said component figure list for a component figure of said repetitive pattern group, wherein the specific component figure is referred from a plurality of pointers.

32. A computer readable medium having encoded therein programming instructions for a method for compressing computer aided design (CAD) data representing a design, the method comprising:

generating data of a first repetitive pattern of said design whose number of repetition times is represented by a predetermined number of bits; and generating data of a second repetitive pattern of said design comprising repetitions of said first repetitive pattern, said second repetitive pattern data comprising a pointer to said first repetitive pattern data.

33. A computer readable medium having encoded therein programming instructions for a method for compressing computer aided design (CAD) data representing a design, the method comprising:

generating data of a first repetitive pattern of said design whose number of repetition times is represented by a first predetermined number of bits;

generating data of a second repetitive pattern of said design whose number of repetition times is represented by one of the first predetermined number of bits and a second predetermined number of bits; and generating data of a third repetitive pattern of said design comprising repetitions of said first repetitive pattern and said second repetitive pattern, said third repetitive pattern data comprising a pointer to said first repetitive pattern data and a pointer to said second repetitive pattern data.

34. A computer readable medium having encoded therein programming instructions for a method for compressing computer aided design (CAD) data representing a design, the method comprising:

generating first data representing one of a component figure, a single figure, a pattern group, and a repetitive pattern of said design; and generating repetitive pattern data for a repetitive pattern of said design comprising one of said component figure, single figure, pattern group, and repetitive pattern of said design, said repetitive pattern data comprising a pointer to said first data and an identifier indicating whether said first data which is pointed to by said pointer represents said component figure, said single figure, said pattern group, or said repetitive pattern.

35. A computer readable medium having encoded therein programming instructions for a method for compressing computer aided design (CAD) data representing a design, the method comprising:

generating a set of first data representing one of a component figure, a single figure, a pattern group, and a repetitive pattern of said design, said first set of data comprising an identifier indicating whether said set of first data represents said component figure, said single figure, said pattern group, or said repetitive pattern; and generating repetitive pattern data for a repetitive pattern of said design comprising one of said component figure, single figure, pattern group, and repetitive pattern, said repetitive pattern data comprising a pointer to said first set of data.

36. A computer readable medium having encoded therein programming instructions for a method for compressing computer aided design (CAD) data representing a design, the method comprising:

generating first data representing one of a component figure, a single figure, a pattern group, and a repetitive pattern of said design in one of designated regions for a component figure, a single figure, a pattern group, and a repetitive pattern; and generating repetitive pattern data for a repetitive pattern of said design, said repetitive pattern data comprising a pointer to said first data.

37. A computer readable medium having encoded therein programming instructions for a method for compressing computer aided design (CAD) data representing a design, the method comprising:

generating first data representing one of a component figure, a single figure, a pattern group, and a repetitive pattern of said design in one of designated files for a component figure, a single figure, a pattern group, and a repetitive pattern; and generating repetitive pattern data for a repetitive pattern of said design, said repetitive pattern data comprising a pointer to said first data.

38. A computer readable medium having encoded therein programming instructions for a method for compressing computer aided design (CAD) data representing a design, the method comprising:

selecting a repetitive pattern group from an input figure group corresponding to a user's operation of an input device; and determining whether or not the selected pattern group is regularly repeated in CAD data that is provided as an input compression source.

39. The computer readable medium set forth in claim 38, wherein the method further comprises:

selecting a region in which to determine whether or not the selected pattern group is regularly repeated corresponding to the user's operation of the input device.

* * * * *